(12) United States Patent
Gan et al.

(10) Patent No.: US 7,253,041 B2
(45) Date of Patent: Aug. 7, 2007

(54) METHOD OF FORMING A THIN FILM TRANSISTOR

(75) Inventors: Feng-Yuan Gan, Hsinchu (TW); Han-Tu Lin, Wuci Township, Taichung County (TW)

(73) Assignee: AU Optronics Corp., Hsinchu (TW)

( * ) Notice: Subject to any disclaimer, the term of this patent is extended or adjusted under 35 U.S.C. 154(b) by 303 days.

(21) Appl. No.: 11/142,931

(22) Filed: Jun. 2, 2005

(65) Prior Publication Data

US 2006/0110862 A1 May 25, 2006

(30) Foreign Application Priority Data

Nov. 22, 2004 (TW) ............................. 93135848 A

(51) Int. Cl.
*H01L 21/84* (2006.01)
(52) U.S. Cl. ............................. 438/158; 257/E21.561
(58) Field of Classification Search ........ 438/158–160; 257/E21.561
See application file for complete search history.

(56) References Cited

U.S. PATENT DOCUMENTS

| 5,210,045 | A | * | 5/1993 | Possin et al. ................ 438/158 |
| 5,273,920 | A | * | 12/1993 | Kwasnick et al. ........... 438/158 |
| 6,165,917 | A | | 12/2000 | Batey et al. ................. 438/792 |
| 2002/0042167 | A1 | | 4/2002 | Chae ........................... 438/149 |

* cited by examiner

*Primary Examiner*—Richard A. Booth
(74) *Attorney, Agent, or Firm*—Thomas, Kayden, Horstemeyer & Risley

(57) ABSTRACT

A method of forming a thin film transistor comprising a deposition procedure of a microcrystal material layer and performing a plasma treatment procedure. The deposition procedure and the plasma treatment procedure are repeated. A buffer layer is thus formed on the gate electrode.

19 Claims, 4 Drawing Sheets

METHOD OF FORMING A THIN FILM TRANSISTOR

BACKGROUND

The present invention relates in general to a method of forming a thin film transistor (TFT). In particular, the present invention relates to a method of forming a thin film transistor with a structure protecting gate electrode.

Thin film transistors are active elements used in active matrix type plate panel display and are usually used to drive active matrix type liquid crystal displays, active matrix type organic light-emitting displays, and image sensors.

In a liquid crystal display (LCD), a liquid crystal layer is sandwiched between two transparent glass substrates, and the thin film transistors are disposed on one of the transparent glass substrates. In the display region of the LCD, an array of pixel areas is defined by horizontally extended gate lines and vertically extended data lines. Each pixel area has a thin film transistor and a pixel electrode.

FIG. 1 is a cross section of a conventional thin film transistor, bottom gate type thin film transistor formed by back channel etching (BCE). The gate electrode 103 is deposited on the insulating substrate 102 using a physical vapor deposition (PVD) process and patterned by photolithography and etching. The gate insulating layer 104, the active channel layer 105, n+ type semiconductor layer 106, and a metal layer 107 are sequentially deposited in a chamber using a plasma enhanced chemical vapor deposition (PECVD) process followed by photolithography and etching to define an active channel region. A passivation layer (not shown) is deposited by a plasma enhanced chemical vapor deposition process to cover the active channel region. A transparent electrode is deposited by physical vapor deposition to serve as the pixel electrode (not shown) and the thin film transistor and its circuits are thus formed.

As liquid crystal displays increase in size, gate lines become longer, inducing signal delay and pulse distortion issues due to the high resistance of the gate lines. Thus, low resistance material is required for manufacture of the gate lines. Copper, a suitable low resistance material, is however reactive and difficult to use. For example, if copper is used as the gate electrode of the thin film transistor, when the copper gate electrode is exposed in an atmosphere of plasma enhanced chemical vapor deposition while the gate insulating layer is formed, the copper gate electrode easily reacts with free radicals from the atmosphere. If silicon oxide (SiOx) is used as the gate insulating layer, the silicon oxide film may detach. If silicon nitride (SiNx) is used as the gate insulating layer, bubbling may occur. Therefore, a buffer layer covering the copper electrode is needed before deposition of the silicon oxide or silicon nitride gate insulating layer.

U.S. Pat. No. 6,165,917 issued to Batey et al., teaches a method of protecting copper, aluminum or other metal gate electrode. After forming the gate electrode, an ammonia-free silicon nitride layer is deposited by plasma enhanced chemical vapor deposition to protect the gate electrode. The processing gas comprises silane/nitrogen/helium/hydrogen of 1:135:100:100.

US early publication No. 2002/0042167 to Chae et al., teaches covering a metal oxide layer on the surface of the gate line and the gate electrode using a thermal treatment to protect the gate line and the gate electrode.

SUMMARY

To solve the above problems, an embodiment of a method of forming a thin film transistor with a structure protecting the gate electrode is provided. After a gate electrode is formed on a substrate, a microcrystal material layer is formed on the gate electrode, and a plasma treatment is then performed to transfer the microcrystal material layer into a buffer layer. A gate insulating layer is formed on the buffer layer, an active channel layer is formed on the gate insulating layer, a source and a drain is formed on the active channel layer, and a source electrode and a drain electrode is formed to contact the source and the drain respectively.

In the above-mentioned method, the buffer layer can be a silicon nitride layer or silicon oxynitride layer. For the silicon nitride layer, the microcrystal material layer can be a silicon layer and a processing gas used in the plasma treatment comprises nitrogen. The microcrystal material layer of the silicon oxynitride layer, can be a silicon layer and a processing gas used in the plasma treatment comprises $N_2O$.

In the above-mentioned method, the steps of forming the microcrystal material layer and performing the plasma treatment are repeated until the buffer layer reaches a determined thickness, such as 50-200 Å.

An embodiment of a method for forming a thin film transistor is provided. The method comprises forming a gate electrode on a substrate; performing a deposition procedure and a plasma treatment procedure on a microcrystal material layer on the gate electrode under a vacuum, the deposition procedure and the plasma treatment procedure being repeated to form a buffer layer covering the gate electrode; depositing a gate insulating layer, a semiconductor layer and a first conductive type semiconductor layer on the buffer layer without breaking the vacuum system; forming a metal layer on the first conductive type semiconductor layer; and defining the metal layer and the first conductive type semiconductor layer to form a source electrode, a drain electrode, a source and a drain.

DESCRIPTION OF THE DRAWINGS

The preferred embodiment of the invention is hereinafter described with reference to the accompanying drawings in which.

DETAILED DESCRIPTION

Figure 1:
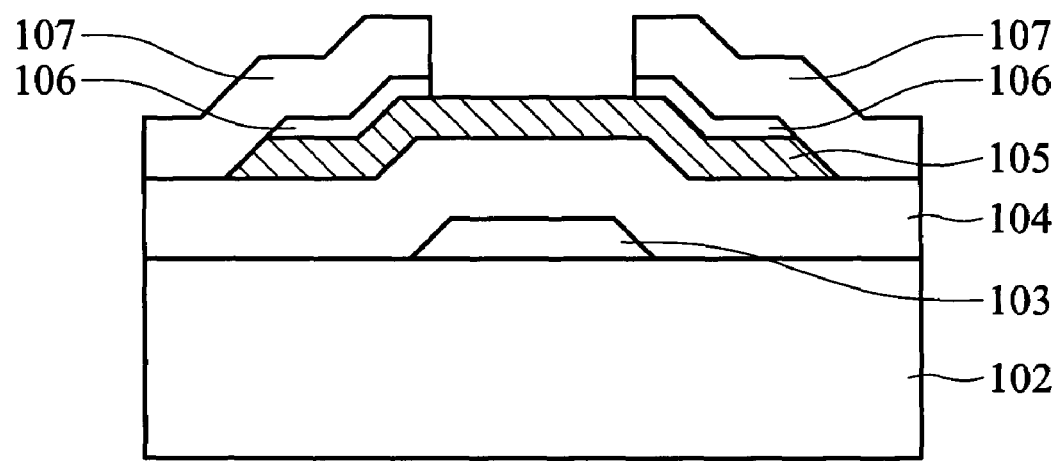
FIG. 1 is a cross section of a conventional thin film transistor.

As shown in FIG. 1, the copper gate electrode and the gate line are exposed in a plasma atmosphere containing $NH_3$ during deposition of the gate insulating layer, inducing adhesion and interaction issues. In order to prevent these problems, a microcrystal material layer, such as a silicon layer, is deposited and treated with plasma, such as nitrogen plasma, to form a thin buffer layer on the surface of the copper gate electrode before depositing the gate insulating layer with plasma enhanced chemical vapor deposition (PECVD).

FIGS. 2A to 2F are cross sections showing an embodiment of a method for forming a thin film transistor.

Figure 2A:
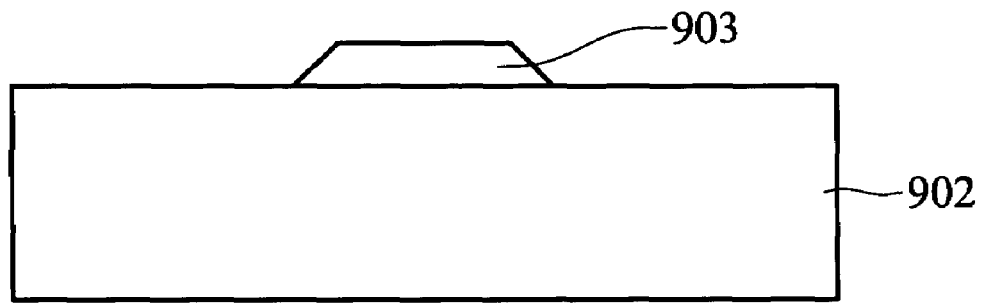
FIGS. 2A to 2F are cross sections showing a method for forming a thin film transistor according to an embodiment of this invention.

Referring to FIG. 2A, a substrate 902, such as glass substrate, is provided, and the thickness is, for example, less than 1 mm. A low resistance metal layer, such as copper (Cu), silver (Ag), aluminum (Al), molybdenum (Mo), chromium (Cr), tungsten (W), tantalum (Ta), or their alloy, or a stacked layer thereof, is deposited on the substrate 902 by, for example, standard vacuum deposition process. The metal layer is then defined to form a gate electrode 903.

Figure 2B:
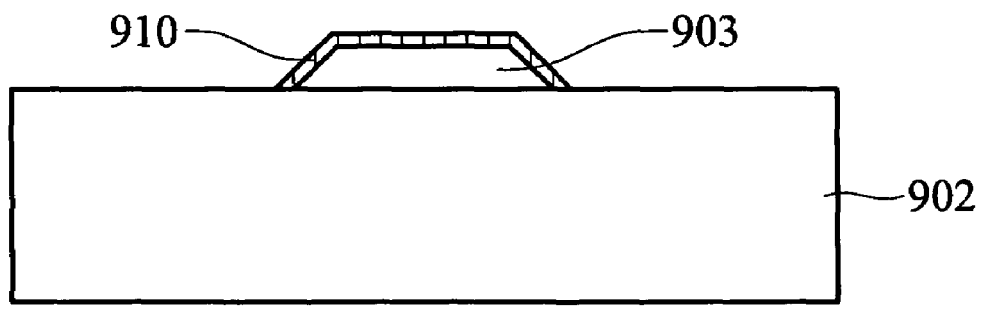

Referring to FIG. 2B, a buffer layer 910 is formed to cover the gate electrode 903, and the buffer layer 910 can be extended to the surface of the substrate 902. The material of the buffer layer 910 is for example $SiN_x$. The method of forming the buffer layer 910 is, for example, depositing a silicon layer with PECVD using processing gases $SiH_4/H_2$ with a ratio of less than 20 percent by volume for about 10-20 seconds and then treating the silicon layer with nitrogen ($N_2$) plasma for about 20 seconds, to form the buffer layer 910 comprising $SiN_x$. The deposition step and the plasma treatment step can be repeated until the buffer layer reaches a determined thickness, such as 50-200 Å. If the buffer layer 910 comprises silicon oxynitride ($SiON_x$), the processing gas used in the plasma treatment step comprises $N_2O$.

Figure 2C:
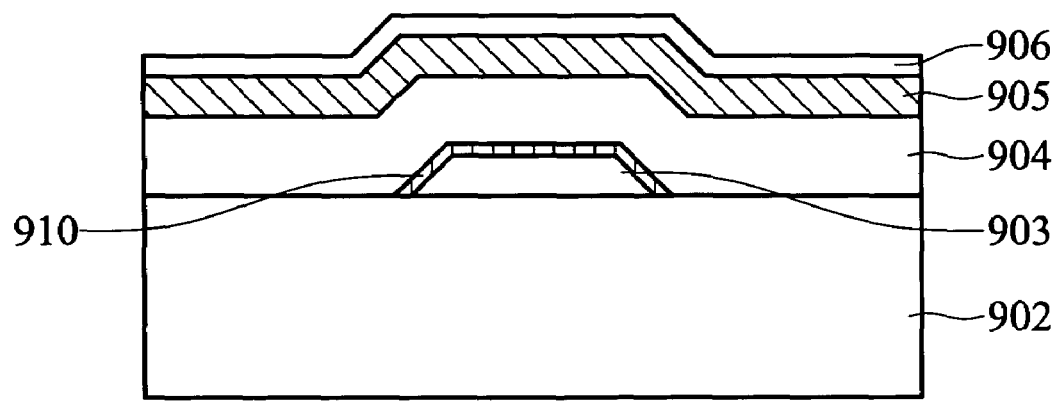

Referring to FIG. 2C, the dielectric layer 904, the semiconductor layer 905 and the first conductive type semiconductor layer 906 are formed in sequence using, for example, a PECVD process to blanket the entire substrate. The dielectric layer 904 is referred to as a gate insulating layer, and the material thereof is for example $SiO_x$, $SiN_x$, $SiON_x$, $TaO_x$. (such as $Ta_2O_5$), or $Al_2O_3$. The material of the semiconductor layer 905 is, for example, a-Si:H. The material of the first conductive type semiconductor layer 906 which is an n+ type semiconductor layer 906 comprises, for example, amorphous silicon doped with high concentration n dopants (n+ a-Si:H), such as P, As or Sn dopants.

The above mentioned buffer layer 910, gate insulating layer 904, semiconductor layer 905 and n+ type semiconductor layer 906 can be deposited in a PECVD process chamber without breaking the vacuum.

Figure 2D:
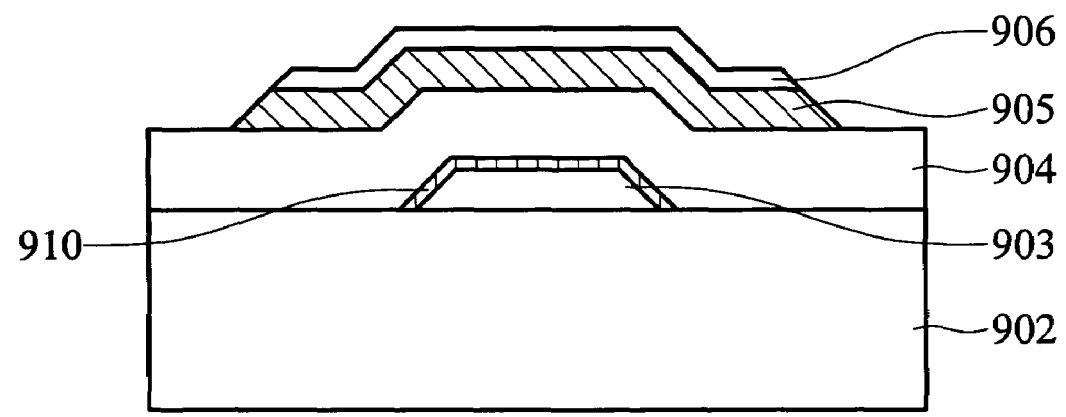

Referring to FIG. 2D, photolithography and etching processes are performed to selectively etch the semiconductor layer 905 and the n+ type semiconductor layer 906, so as to transfer the semiconductor layer 905 into the active channel layer 905 as the active channel region of the thin film transistor.

Figure 2E:
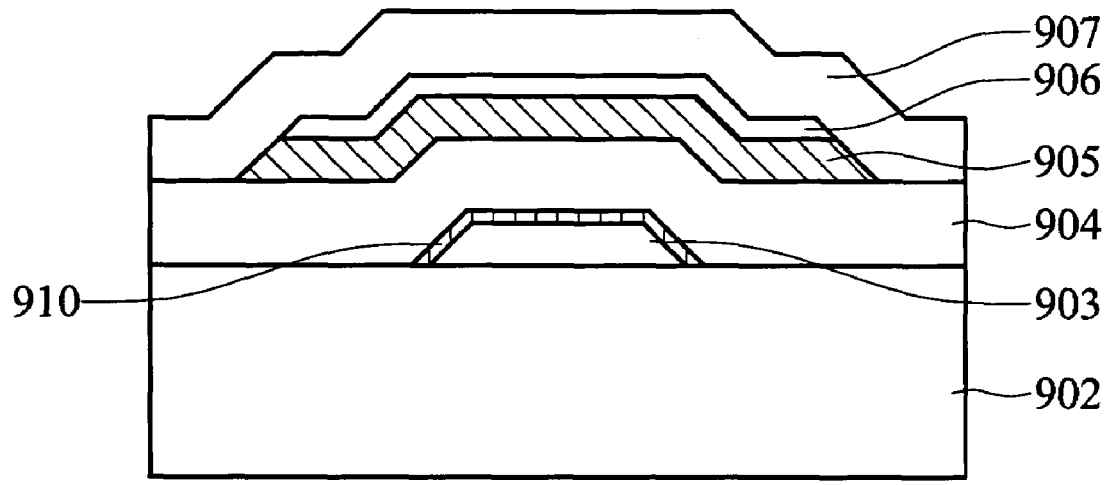

Referring to FIG. 2E, the metal layer 907 is formed on and blankets the n+ type semiconductor layer 906 using a vacuum deposition process. The material of the metal layer 907 is Al, Mo, Cr, W, Ta, Cu, Ag, their alloys or a stacked layer thereof.

Figure 2F:
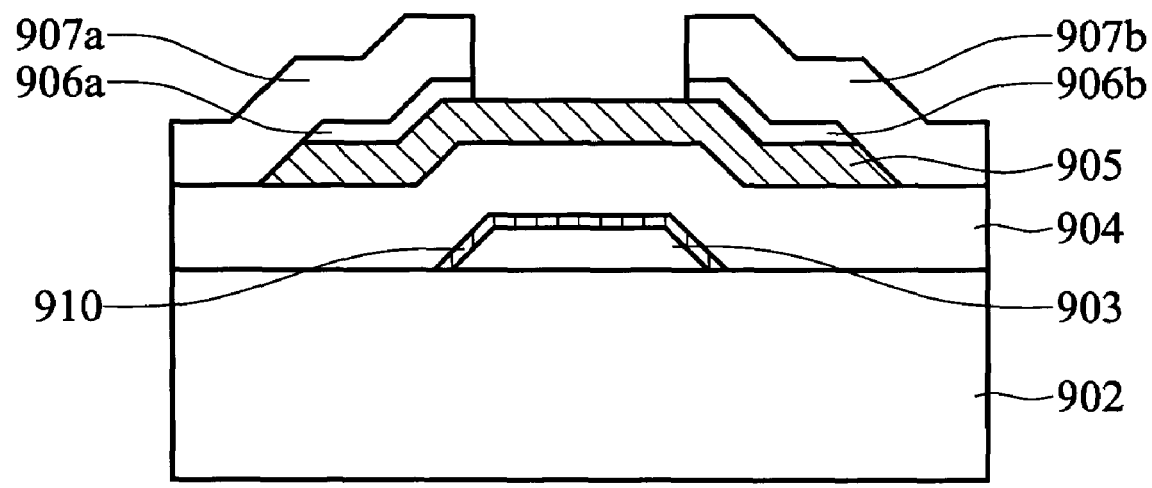

Referring to FIG. 2F, the metal layer 907 and n+ type semiconductor layer 906 are selectively etched to form a source electrode 907a, a drain electrode 907b, a source 906a and a drain 906b of the thin film transistor. A passivation layer, such as a silicon nitride layer or a polyimide layer, covers the source electrode 907a, the drain electrode 907b and the active channel layer 905 to protect the channel region. A contact window is formed in the passivation layer, and a transparent pixel electrode (not shown) is formed to electrically contact the drain electrode 907b through the contact window.

Because the buffer layer is formed on the gate electrode 903 after formation thereof by deposition and plasma treatment procedures of the microcrystal material layer, the gate electrodes are free from damage during the subsequent deposition process of the gate insulating layer.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A method of forming a thin film transistor, comprising:
providing a substrate;
forming a gate electrode on the substrate;
forming a microcrystal material layer on the gate electrode;
performing a plasma treatment to transfer the microcrystal material layer into a buffer layer;
forming a gate insulating layer on the buffer layer;
forming an active channel layer on the gate insulating layer;
forming a source and a drain on the active channel layer; and
forming a source electrode and a drain electrode contacting the source and the drain respectively.

2. The method as claimed in claim 1, wherein the buffer layer comprises silicon nitride.

3. The method as claimed in claim 2, wherein the microcrystal material layer comprises microsilicon.

4. The method as claimed in claim 3, wherein a processing gas used in the plasma treatment comprises nitrogen.

5. The method as claimed in claim 1, wherein the buffer layer comprises silicon oxynitride.

6. The method as claimed in claim 5, wherein the microcrystal material layer comprises silicon.

7. The method as claimed in claim 6, wherein a processing gas used in the plasma treatment comprises $N_2O$.

8. The method as claimed in claim 1, wherein the microcrystal material layer comprises a silicon layer deposited by an enhanced plasma chemical vapor deposition (PECVD) process using a processing gas comprising $SiH_4/H_2$ with a ratio of less than 20 percent by volume.

9. The method as claimed in claim 1, wherein the steps of forming the microcrystal material layer and performing the plasma treatment are repeated until the buffer layer reaches a determined thickness.

10. The method as claimed in claim 1, wherein the buffer layer has a thickness of about 50 to 200 Å.

11. The method as claimed in claim 1, wherein the gate electrode comprises Cu, Ag, Al, Mo, Cr, W, Ta, their alloys, or a stacked layer thereof.

12. A method of forming a thin film transistor, comprising:
providing a substrate;
forming a gate electrode on the substrate;
performing a deposition procedure and a plasma treatment procedure of a microcrystal material layer on the gate electrode under a vacuum system, the deposition procedure and the plasma treatment procedure being repeated to form a buffer layer covering the gate electrode;
depositing a gate insulating layer, a semiconductor layer and a first conductive type semiconductor layer on the buffer layer without breaking the vacuum system;
forming a metal layer on the first conductive type semiconductor layer; and
defining the metal layer and the first conductive type semiconductor layer to form a source electrode, a drain electrode, a source and a drain.

13. The method as claimed in claim 12, wherein the buffer layer comprises silicon nitride.

14. The method as claimed in claim 13, wherein the microcrystal material layer comprises silicon layer and a processing gas used in the plasma treatment procedure comprises nitrogen.

15. The method as claimed in claim 12, wherein the buffer layer comprises a silicon oxynitride layer.

16. The method as claimed in claim 15, wherein the microcrystal material layer comprises silicon layer and a processing gas used in the plasma treatment procedure comprises $N_2O$.

17. The method as claimed in claim 12, wherein the microcrystal material layer comprises silicon layer deposited by enhanced plasma chemical vapor deposition (PECVD) process using a processing gas comprising $SiH_4$/$H_2$ with a ratio of less than 20 percent by volume.

18. The method as claimed in claim 12, wherein the buffer layer has a thickness of about 50 to 200 Å.

19. The method as claimed in claim 12, wherein the first conductive type semiconductor layer comprises an n+ type semiconductor layer.

* * * * *